United States Patent
Jardine et al.

(10) Patent No.: US 9,589,395 B2
(45) Date of Patent: Mar. 7, 2017

(54) TOOL INTERFACE CONNECTOR WIRELESS ADAPTER COMPACT DESIGN

(75) Inventors: Lee Jardine, Owatonna, MN (US); Charles Warren Beal, West Yorkshire (GB)

(73) Assignee: Bosch Automotive Service Solutions Inc., Warren, MI (US)

( * ) Notice: Subject to any disclaimer, the term of this patent is extended or adjusted under 35 U.S.C. 154(b) by 815 days.

(21) Appl. No.: 12/900,549

(22) Filed: Oct. 8, 2010

(65) Prior Publication Data

US 2011/0106371 A1    May 5, 2011

Related U.S. Application Data

(60) Provisional application No. 61/257,211, filed on Nov. 2, 2009.

(51) Int. Cl.
| | | |
|---|---|---|
| G07C 5/08 | (2006.01) | |
| H01R 31/06 | (2006.01) | |
| G01R 1/04 | (2006.01) | |
| G01R 31/00 | (2006.01) | |

(52) U.S. Cl.
CPC ......... *G07C 5/0808* (2013.01); *H01R 31/065* (2013.01); *G01R 1/0416* (2013.01); *G01R 31/006* (2013.01); *G07C 2205/02* (2013.01); *H01R 2201/20* (2013.01); *H01R 2201/26* (2013.01)

(58) Field of Classification Search
CPC ............. H01R 12/724; H01R 23/7073; H01R 23/6893; H01R 2201/26; H01R 12/721; H01R 13/665; H01R 27/02; H01R 31/06; H01R 31/065; G07C 2205/02; G07C 5/008; Y02T 10/40; Y02T 10/47; Y10T 29/53209

USPC ................................................ 701/29.1–31.5
See application file for complete search history.

(56) References Cited

U.S. PATENT DOCUMENTS

| | | | | |
|---|---|---|---|---|
| 5,459,660 A | * | 10/1995 | Berra | 701/29.6 |
| 5,683,261 A | * | 11/1997 | Ahles | H01R 29/00 |
| | | | | 439/189 |
| 6,263,268 B1 | * | 7/2001 | Nathanson | 701/31.5 |
| 6,407,554 B1 | * | 6/2002 | Godau et al. | 324/503 |
| 7,225,065 B1 | * | 5/2007 | Hunt et al. | 701/33.2 |
| 7,584,030 B1 | * | 9/2009 | Graham | 701/33.3 |
| 8,612,086 B2 | * | 12/2013 | Jardine | 701/29.1 |

(Continued)

FOREIGN PATENT DOCUMENTS

| | | | | |
|---|---|---|---|---|
| EP | 217774 A1 | * | 4/1987 | F02M 65/00 |
| EP | 0217774 A1 | | 4/1987 | |
| WO | WO 8906839 A1 | * | 7/1989 | F02B 77/083 |

OTHER PUBLICATIONS

European Search Report, Appl. No. EP 10189478, dated Jan. 26, 2011.

*Primary Examiner* — Dale Moyer
(74) *Attorney, Agent, or Firm* — Baker Hostetler LLP

(57) ABSTRACT

A vehicular diagnostic tool interface device that may be connected to a vehicular diagnostic tool, typically through an available port thereof, that enhances the functionality of the overall tool. The interface device is configured in such a manner as to provide physical protection to more sensitive components such as, for example, wireless transceivers. The interface device is also configured to minimize the distance that it protrudes from the diagnostic tool. Also, a method of operating such a vehicular diagnostic tool.

20 Claims, 3 Drawing Sheets

(56) References Cited

U.S. PATENT DOCUMENTS

| | | | |
|---|---|---|---|
| 2003/0060953 A1* | 3/2003 | Chen | G06Q 90/00 701/31.4 |
| 2004/0249557 A1* | 12/2004 | Harrington et al. | 701/115 |
| 2006/0217914 A1 | 9/2006 | Bertness | |
| 2007/0073459 A1* | 3/2007 | Webster et al. | 701/29 |
| 2007/0073460 A1* | 3/2007 | Bertosa et al. | 701/29 |
| 2007/0156311 A1* | 7/2007 | Elcock | G07C 5/008 701/31.4 |
| 2008/0103653 A1 | 5/2008 | Raichle et al. | |
| 2008/0268662 A1 | 10/2008 | Krivtsov et al. | |
| 2009/0299900 A1* | 12/2009 | Chen | 705/40 |
| 2011/0054732 A1* | 3/2011 | Jardine | 701/33 |
| 2011/0098879 A1* | 4/2011 | Basir | G07C 5/008 701/31.4 |
| 2016/0042578 A1* | 2/2016 | Whitehead | G07C 5/0808 701/33.3 |

* cited by examiner

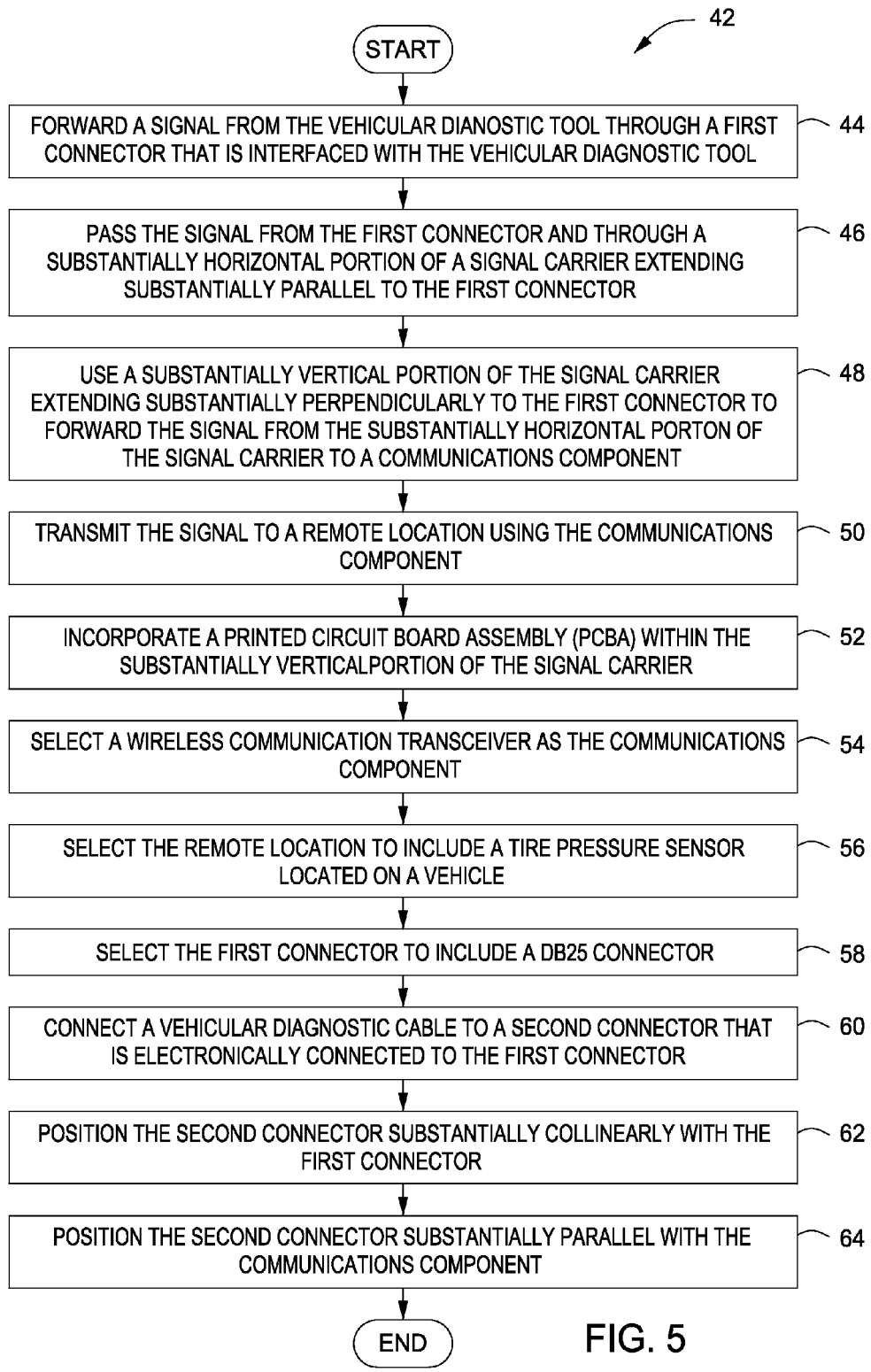

TOOL INTERFACE CONNECTOR WIRELESS ADAPTER COMPACT DESIGN

CROSS-REFERENCE TO RELATED APPLICATION

The present application claims the benefit of U.S. Provisional Patent Application No. 61/257,211 filed on Nov. 2, 2009, and entitled "TOOL INTERFACE CONNECTOR WIRELESS ADAPTER COMPACT DESIGN" by Lee Jardine.

FIELD OF THE INVENTION

The present invention relates generally to vehicular diagnostic tools and to components connected thereto in order to enhance the functionality thereof. The present invention also generally relates to methods of operating and manufacturing such scan tools and components.

BACKGROUND OF THE INVENTION

Currently available vehicular diagnostic scan tools are configured to conduct one or more tests on one or more systems of one or more types of vehicles. For example, currently available vehicular diagnostic tools may be configured to diagnose the anti-lock braking system of an automobile, the electrical system of a motorcycle and/or the transmission system of a piece of heavy machinery (e.g., a tractor).

In order to conduct the above-mentioned tests and/or to monitor the operation of one or more systems in the vehicles in question, vehicular scan tools communicate with electronic components (e.g., vehicular system controllers, sensors, etc.) within the vehicles. The communication may be effectuated via cable (e.g., RS-232 cables) and/or wirelessly.

In certain instances, it is desirable for a vehicular diagnostic tool to communicate with two or more electronic components in a vehicle in order to perform and single test. For example, it is sometimes desirable for a vehicular diagnostic tool to be simultaneously connected to the central computing system of a vehicle via a first cable (e.g., an RS-232 cable) and to a portion of the vehicle's electrical system via a second cable (e.g., a USB cable). In such instances, two different communications ports on the vehicular diagnostic tool are used.

The above notwithstanding, because of geometric restrictions and/or budgetary considerations, the number of ports on a vehicular diagnostic tool is limited. As such, particularly in compact and inexpensive vehicular diagnostic tools, interface devices that allow for multiple cables to be connected to a single port are sometimes used. However, these interface devices protrude significant distances from the vehicular diagnostic tool. As such, the interface devices increase the probability of the user of the diagnostic tool accidentally hitting the interface device against a workbench, vehicle, etc., thereby damaging the interface device and/or tool. Also, as an interface device protrudes further from a diagnostic tool, the lever arm increases and an accidental collision of the end of the interface device against a fixed object increases the amount of destructive force that is applied to the interface device and tool.

SUMMARY OF THE INVENTION

At least in view of the above, it would be desirable to provide novel and compact vehicular diagnostic tool interface devices that protrude relatively short distances from the vehicular diagnostic tools to which they are attached. It would also be desirable to provide novel methods of operating vehicular diagnostic tools with such interface devices.

The foregoing needs are met, to a great extent, by one or more embodiments of the present invention. According to one such embodiment, a vehicular diagnostic tool interface device is provided. The device includes a first connector interfaceable with a vehicular diagnostic tool. The device also includes a communications component. In addition, the device further includes a signal carrier extending between the first connector and the communications component, wherein the signal carrier is configured to transport a signal between the first connector and the communications component. The signal carrier itself includes a substantially horizontal portion extending substantially parallel to the first connector. The signal carrier also includes a substantially vertical portion extending substantially perpendicularly to the first connector.

In accordance with another embodiment of the present invention, a method of operating a vehicular diagnostic tool is provided. The method includes forwarding a signal from the vehicular diagnostic tool through a first connector that is interfaced with the vehicular diagnostic tool. The method also includes passing the signal from the first connector and through a substantially horizontal portion of a signal carrier extending substantially parallel to the first connector. In addition, the method also includes using a substantially vertical portion of the signal carrier extending substantially perpendicularly to the first connector to forward the signal from the substantially horizontal portion of the signal carrier to a communications component. Further, the method also includes transmitting the signal to a remote location using the communications component.

In accordance with yet another embodiment of the present invention, another vehicular diagnostic tool interface device is provided. The device includes means for connecting with a vehicular diagnostic tool. The device also includes means for communicating with a device remote to the vehicular diagnostic tool. In addition, the device also includes means for forwarding a signal between the means for connecting and the means for communicating. The means for forwarding itself includes a substantially horizontal portion extending substantially parallel to the means for connecting. The means for forwarding also includes a substantially vertical portion extending substantially perpendicularly to the means for connecting.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

FIG. 5 is a flowchart illustrating steps of a method of operating a vehicular diagnostic tool according to an embodiment of the present invention.

DETAILED DESCRIPTION

Figure 1:
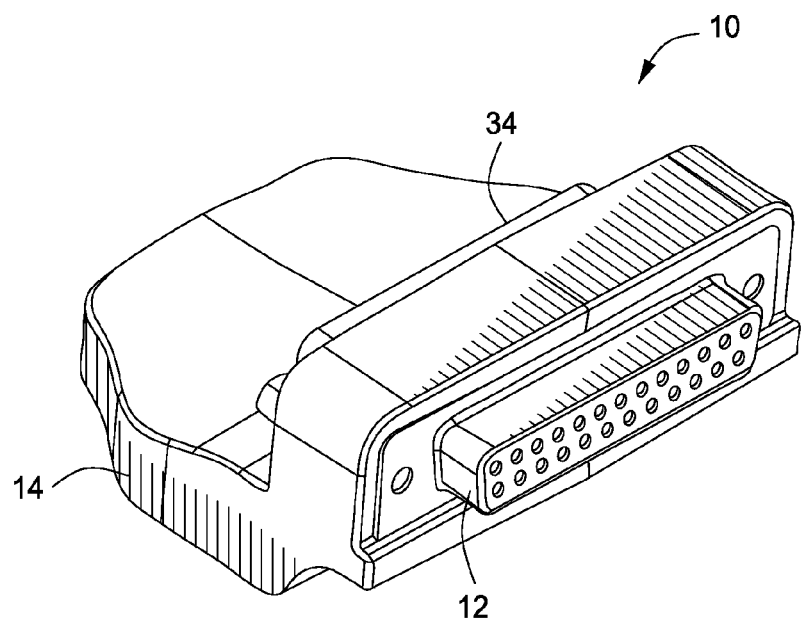
FIG. 1 is a perspective view of a vehicular diagnostic tool interface device according to an embodiment of the present invention.

The invention will now be described with reference to the drawing figures, in which like reference numerals refer to like parts throughout. FIG. 1 is a perspective view of a vehicular diagnostic tool interface device 10 according to an embodiment of the present invention. As illustrated in FIG. 1, the interface device 10 includes a first connector 12 interfaceable with a vehicular diagnostic tool 18 (see FIG. 3).

According to certain embodiments of the present invention, the first connector 12 plugs directly into a port 26 of a vehicular diagnostic tool 18 (see FIGS. 2 and 3) and is thereby electronically connected to the diagnostic tool 18. As illustrated in FIG. 1, according to certain embodiments of the present invention, the first connector 12 includes a DB25 connector portion with 25 pins. However, the first connector 12 with other geometries and/or electrical configurations are also within the scope of the present invention. Particularly desirable designs for first connector 12 include those that allow for the electrical and/or physical connection to at least one port of a vehicular diagnostic tool 18.

Also illustrated in FIG. 1 is a communications component 14. The communications component includes components that allow for communication between the vehicular diagnostic tool 18 to which the interface device 10 is attached and a remote location (e.g., a sensor or processor on a vehicle being diagnosed and/or monitored using the diagnostic tool 18). According to certain embodiments of the present invention, the communications component 14 includes a wireless communication transceiver 16 (see FIG. 3) that is configured to allow for signals to be transmitted to and received from the remote location mentioned above. When communicating with a device at the remote location, the communications component 14 may utilize, for example, the Bluetooth™ communications protocol, the WiFi™ communications protocol and/or any other communications protocol that proves to be convenient and/or available.

According to certain embodiments of the present invention, the transceiver 16 in the communications component 14 is configured to communicate with a tire pressure sensor (not illustrated) located on a vehicle. More specifically, according to some of these embodiments of the present invention, pressure sensors are mounted in one or more of a vehicle's tires (e.g., adjacent to a tire's valve) and wireless relay data such as, for example, tire pressure and temperature back to the transceiver 16. As another alternative, the communication between the transceiver 16 and the pressure sensor may also occur through an intermediate device (not illustrated) that is positioned closer to the sensor than the vehicular diagnostic tool 18. The intermediate device, according to certain embodiments of the present invention, is lighter than the diagnostic tool 18, more easily positioned near the sensor than the diagnostic tool 18, less susceptible to damage than the diagnostic tool 18 and/or less expensive to replace than the diagnostic tool 18 in the event that damage does occur.

Figure 2:
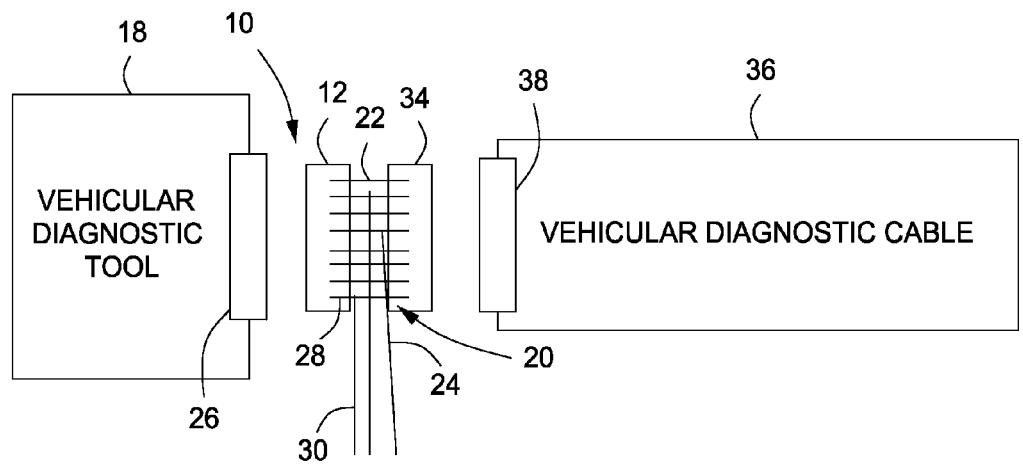
FIG. 2 is a schematic view of components that are included in the vehicular diagnostic tool interface device illustrated in FIG. 1 according to an embodiment of the present invention.
Figure 3:
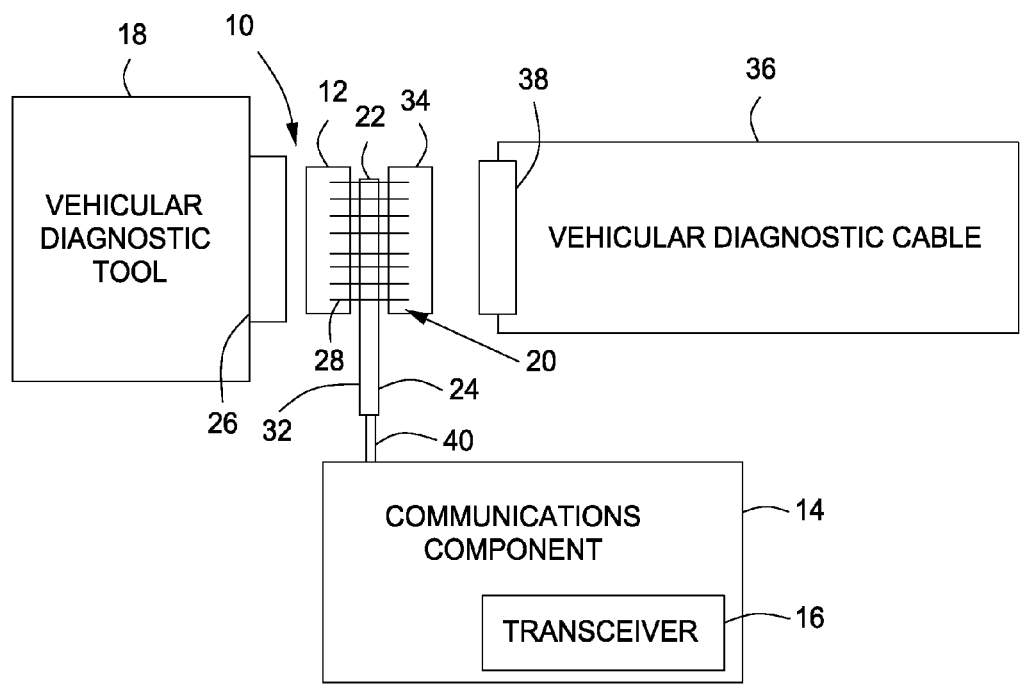
FIG. 3 is a schematic view of components that are included in the vehicular diagnostic tool interface device illustrated in FIG. 1 according to another embodiment of the present invention.

FIG. 2 is a schematic view of components that are included in the vehicular diagnostic tool interface device 10 illustrated in FIG. 1 according to an embodiment of the present invention. FIG. 3 is a schematic view of components that are included in the vehicular diagnostic tool interface device 10 illustrated in FIG. 1 according to another embodiment of the present invention. As illustrated in both FIGS. 2 and 3, the interface device 10 includes a signal carrier 20 that extends between the first connector 12 and the communications component 14.

The signal carrier 20 is configured to transport a signal (e.g., a signal received from the above-mention tire pressure sensor or a signal being transmitted thereto from the vehicular diagnostic tool 18) between the first connector 12 and the communications component 14. According to certain embodiments of the present invention (e.g., when the first connector 12 takes the form of a DB25 connector); the signal carrier 20 includes a plurality of pins made from one or more electrically conductive materials.

As illustrated in FIGS. 2 and 3, according to certain embodiments of the present invention, the signal carrier 20 includes a substantially horizontal portion 22 that extends in a direction that is substantially parallel to the first connector 12. As illustrated in these same figures, the signal carrier 20 also includes a substantially vertical portion 24 that extends in a direction that is substantially perpendicular to the first connector 12.

According to certain embodiments of the present invention, the substantially horizontal portion 22 includes a first pin portion 28 (see FIGS. 2 and 3) that is electronically connected to and that extends from the first connector 12. As illustrated in FIG. 2, the substantially vertical portion 24 may include one or more flyleads 30. The circuit access flyleads 30, according to certain embodiments of the present invention, are routed from the first pin portion 28 and to allow access to the communications component 14 and/or to reduce the overall distance that the interface device 10 protrudes from the diagnostic tool 18 when connected thereto. The flyleads 30 may, for example, be connected to another connector (not illustrated in FIG. 2), a printed circuit board assembly (PCBA) (not illustrated in FIG. 2), etc.

As illustrated in FIG. 3, according to certain embodiments of the present invention, the substantially vertical portion 24 includes a PCBA 32 that is electronically connected to the first pin portion 28 and that extends in a direction that is substantially perpendicular to the first connector 12. According to certain embodiments of the present invention, the PCBA 32 is a sandwiched between the first connector 12 and a second connector 34 that itself may be interfaced with a vehicular diagnostic cable 36 (e.g., an RS-232 cable or a USB cable) through the cable's interface 38. As illustrated in FIG. 3, the first pin portion 28 may include through pins (or surface mount pins, which are not illustrated) to reduce the distance between the first connector 12 and the second connector 34, thereby reducing the distance that the tool interface 10 would protrude from the diagnostic tool 18. As further illustrated in FIG. 3, the signal carrier 20 may also include a second pin portion 40 that is electronically connected to the PCBA 32 and to the communications component 14.

Figure 4:
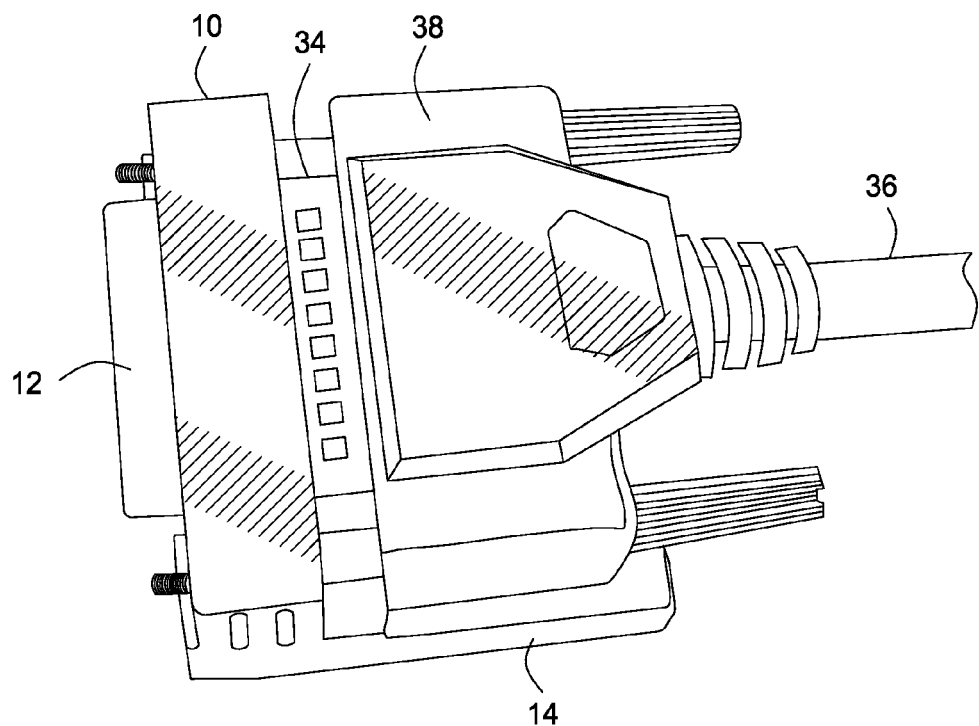
FIG. 4 is a perspective view of the vehicular diagnostic tool interface device illustrated in FIG. 1 engaged with a cable.

As mentioned above, the tool interface device 10 may include the second connector 34. This second connector 34, as illustrated in FIGS. 2-4, is interfaceable with the vehicular diagnostic cable 36 and, as illustrated in FIGS. 2-3, is electronically connected to the first connector 12. As most clearly illustrated in FIG. 4, according to certain embodiments of the present invention, at least a portion of the second connector 34 may be positioned substantially parallel to at least a portion of the communications component 14 and may be positioned substantially collinearly with the first connector 12. In fact, according to the embodiment shown in FIG. 4, the second connector 34 is positioned above the communications component 14 when the first connector 12 is physically attached to the vehicular diagnostic tool 18 illustrated in FIGS. 2 and 3. This is particularly true when the vehicular diagnostic tool 18 is being held by a user in an operable position (i.e., where the user is able to see the display and/or user interface of the diagnostic tool 18). In the embodiment illustrated in FIG. 4, this allows the relatively sturdy cable 36 and cable interface 38 to protect the communications component 14 from an impact from above the diagnostic tool 18. This configuration also minimizes the total distance that the cable interface 38, communications component 14 and overall interface device 10 protrudes from the diagnostic tool 18 when connected thereto.

FIG. 5 is a flowchart 42 illustrating the steps of a method of operating a vehicular diagnostic tool according to an embodiment of the present invention. More specifically, step 44 of the method 42 specifies forwarding a signal from the vehicular diagnostic tool (e.g., tool 18 discussed above) through a first connector (e.g., first connector 12) that is interfaced with the vehicular diagnostic tool. It should be noted that signals may also be forwarded to the diagnostic tool according to certain embodiments of the present invention. It should also be noted that the signal in question may be related to the performance of one or more diagnostic tests being performed on a vehicle, the monitoring of a vehicular system or may be of a more general nature.

Step 46 of the flowchart 42 then specifies passing the signal from the first connector and through a substantially horizontal portion of a signal carrier extending substantially parallel to the first connector (e.g., horizontal portion 22 of the signal carrier 20 illustrated in FIGS. 2 and 3). Next, step 48 specifies using a substantially vertical portion of the signal carrier extending substantially perpendicularly to the first connector (e.g., vertical portion 24) to forward the signal from the substantially horizontal portion of the signal carrier to a communications component. Then, step 50 specifies transmitting the signal to a remote location using the communications component (e.g., sending the signal to a sensor or electronic component in a vehicle being diagnosed via a cable or wirelessly).

According to step 52, a printed circuit board assembly (PCBA) (e.g., PCBA 32 illustrated in FIG. 3) is incorporated within the substantially vertical portion of the signal carrier. However, other embodiments of the present invention allow for the PCBA may be oriented in any other direction. Also, according to step 54, a wireless communication transceiver (e.g., transceiver 16) is selected as the communications component. In addition, according to step 56, the remote location is selected to include a tire pressure sensor located on a vehicle and, according to step 58, the first connector is selected to include a DB25 connector. As an alternative, as described above, the communication between the transceiver 16 and the tire pressure sensor may take place though an intermediate device that is remote to the sensor.

Step 60 next specifies connecting a vehicular diagnostic cable (e.g., cable 36) to a second connector (e.g., second connector 34) that is electronically connected to the first connector. Then, step 62 specifies positioning the second connector substantially collinearly with the first connector and step 64 specifies positioning the second connector substantially parallel with the communications component. An example of a vehicular diagnostic tool interface device where steps 60 through 64 have been implemented is illustrated in FIG. 4.

As will become apparent to one of skill in the art upon practicing one or more embodiments of the present invention, the steps in the flowchart 42 may be rearranged without deviating from the present invention. For example, the incorporating and selecting steps (i.e., steps 52 through 58) may easily be performed prior to the forwarding step (i.e., step 44).

The many features and advantages of the invention are apparent from the detailed specification, and thus; it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A vehicular diagnostic tool interface device, comprising:
    a first connector of the vehicular diagnostic tool interface device interfaceable with a vehicular diagnostic tool;
    a communications component;
    a signal carrier extending between the first connector and the communications component, wherein the signal carrier is configured to transport a signal between the first connector and the communications component and wherein the signal carrier includes:
        a substantially horizontal portion extending substantially parallel to the first connector; and
        a substantially vertical portion extending substantially perpendicularly to the first connector and configured to forward the signal from the substantially horizontal portion of the signal carrier to the communications component; and
    a second connector of the vehicular diagnostic tool interface device interfaceable with a vehicular diagnostic cable, the second connector being electronically connected directly to the first connector by a first pin portion of the substantially horizontal portion, said first pin portion permanently extending conductively from the first connector all the way through to the second connector.

2. The vehicular diagnostic tool interface device of claim 1, wherein the first connector comprises a DB25 connector.

3. The vehicular diagnostic tool interface device of claim 1, wherein the signal carrier comprises a plurality of pins.

4. The vehicular diagnostic tool interface device of claim 1, wherein the signal carrier comprises:
- a printed circuit board assembly (PCBA) electronically connected to the first pin portion; and
- a second pin portion electronically connected to the PCBA and to the communications component, wherein the PCBA extends in a direction that is substantially perpendicular to the first connector.

5. The vehicular diagnostic tool interface device of claim 1, wherein the communications component comprises a wireless communication transceiver.

6. The vehicular diagnostic tool interface device of claim 5, wherein the wireless communication transceiver is configured to communicate with a tire pressure sensor located on a vehicle.

7. The vehicular diagnostic tool interface of claim 1, wherein a portion of the second connector is positioned substantially parallel to a portion of the communications component.

8. The vehicular diagnostic tool interface of claim 7, wherein the second connector is positioned substantially collinearly with the first connector.

9. The vehicular diagnostic tool interface of claim 7, wherein the second connector is positioned above the communications component when the first connector is physically attached to the vehicular diagnostic tool and when the vehicular diagnostic tool is being held by a user in an operable position.

10. The vehicular diagnostic tool interface of claim 1, wherein the substantially vertical portion comprises a flylead.

11. A method of operating a vehicular diagnostic tool, the method comprising:
- forwarding a signal from the vehicular diagnostic tool through a first connector of a vehicle diagnostic tool interface device that is interfaced with the vehicular diagnostic tool;
- passing the signal from the first connector and through a substantially horizontal portion of a signal carrier extending substantially parallel to the first connector;
- using a substantially vertical portion of the signal carrier extending substantially perpendicularly to the first connector to forward the signal from the substantially horizontal portion of the signal carrier to a communications component;
- passing the signal to a second connector of the vehicular diagnostic tool interface device interfaceable with a vehicular diagnostic cable, the second connector being electronically connected directly to the first connector by a first pin portion of the substantially horizontal portion, said first pin portion permanently extending conductively from the first connector all the way through to the second connector; and
- transmitting the signal to a remote location using the communications component.

12. The method of claim 11, further comprising:
incorporating a printed circuit board assembly (PCBA) within the substantially vertical portion of the signal carrier.

13. The method of claim 11, further comprising:
selecting a wireless communication transceiver as the communications component.

14. The method of claim 11, further comprising:
selecting the remote location to include a tire pressure sensor located on a vehicle.

15. The method of claim 11, further comprising:
selecting the first connector to include a DB25 connector.

16. The method of claim 11, further comprising:
connecting the vehicular diagnostic cable to the second connector that is electronically connected to the first connector concurrently with the first connector being interfaced with the vehicular diagnostic tool, and the substantially vertical portion of the signal carrier being interfaced with the communications component.

17. The method of claim 16, further comprising:
positioning the second connector substantially collinearly with the first connector.

18. The method of claim 16, further comprising:
positioning the second connector substantially parallel with the communications component.

19. The method of claim 11, further comprising:
reducing, using a flylead as the substantially vertical portion, an overall protrusion of the vehicular diagnostic tool interface device from the vehicular diagnostic tool during the operating of the vehicular diagnostic tool, the flylead coupling the signal to the communications component.

20. A vehicular diagnostic tool interface device, comprising:
- a first means of the vehicular diagnostic tool interface device for connecting with a vehicular diagnostic tool;
- means for communicating wirelessly with a device remote to the vehicular diagnostic tool;
- means for forwarding a signal between the first means for connecting and the means for communicating, wherein the means for forwarding includes:
  - a substantially horizontal portion extending substantially parallel to the means for connecting; and
  - a substantially vertical portion extending substantially perpendicularly to the means for connecting and configured to forward the signal from the substantially horizontal portion of the means for forwarding to the means for communicating; and
- a second means of the vehicular diagnostic tool interface device for connecting to a vehicular diagnostic cable, the second means for connecting being electronically connected directly to the first means for connecting by a first pin portion of the substantially horizontal portion, said first pin portion permanently extending conductively from the first means for connecting all the way through to the second means for connecting.

* * * * *